(12) United States Patent
Goda et al.

(10) Patent No.: US 8,982,625 B2
(45) Date of Patent: Mar. 17, 2015

(54) MEMORY PROGRAM DISTURB REDUCTION

(75) Inventors: Akira Goda, Boise, ID (US); Mark Helm, Santa Cruz, CA (US); Pranav Kalavade, San Jose, CA (US); Charan Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 13/600,623

(22) Filed: Aug. 31, 2012

(65) Prior Publication Data

US 2014/0063960 A1    Mar. 6, 2014

(51) Int. Cl.
*G11C 16/04* (2006.01)

(52) U.S. Cl.
USPC ............ 365/185.17; 365/185.18; 365/185.22

(58) Field of Classification Search
USPC .......................... 365/185.17, 185.18, 185.22
See application file for complete search history.

(56) References Cited

U.S. PATENT DOCUMENTS

| | | | |
|---|---|---|---|
| 5,182,725 A * | 1/1993 | Andoh et al. ............. 365/185.12 |
| 5,568,420 A * | 10/1996 | Lim et al. ................. 365/185.17 |
| 5,818,756 A * | 10/1998 | Sakui et al. .............. 365/185.17 |
| 6,044,033 A * | 3/2000 | Jang ......................... 365/230.03 |
| 6,266,274 B1 * | 7/2001 | Pockrandt et al. ....... 365/185.17 |
| 6,940,755 B2 * | 9/2005 | Peters et al. .............. 365/185.1 |
| 7,630,236 B2 | 12/2009 | Han et al. |
| 8,520,440 B2 * | 8/2013 | Ahn et al. ................. 365/185.2 |
| 2009/0168513 A1 | 7/2009 | Tanaka |
| 2010/0188898 A1 | 7/2010 | Sarin |
| 2011/0134699 A1 | 6/2011 | Hemink |
| 2011/0194351 A1 | 8/2011 | Kim et al. |
| 2011/0216600 A1 | 9/2011 | Goda et al. |
| 2011/0249503 A1 | 10/2011 | Yamada et al. |
| 2011/0299331 A1 | 12/2011 | Kim |

* cited by examiner

*Primary Examiner* — Pho M Luu
(74) *Attorney, Agent, or Firm* — Schwegman Lundberg & Woessner, P.A.

(57) ABSTRACT

Some embodiments include a memory device and a method of programming memory cells of the memory device. One such method can include applying, during a first pass of programming, a first bias voltage value to a source select gate to isolate memory cells from a source, applying a programming voltage to an access line of a page of the memory cells during the first pass of programming, and applying a second bias voltage value to the source select gate to isolate the memory cells from the source during a second pass of programming. Further devices, systems, and methods are disclosed.

23 Claims, 6 Drawing Sheets

MEMORY PROGRAM DISTURB REDUCTION

BACKGROUND

A variety of computer systems and electronic devices use memory that is not volatile, so that stored data is not lost when power is disconnected. These nonvolatile memories can be reprogrammed, read, and erased electronically, and are well suited to storing data such as music in digital audio players, pictures in digital cameras, and configuration data in cellular telephones. Such memory includes devices commonly known as flash memory, named in part because a flash operation is used to erase the content of a block of data before it is reprogrammed, and is packaged for consumer use in products such as CompactFlash memory cards, USB flash memory drives, and other such devices.

Flash memory comprises a number of cells, each of which can store one or more binary digits (e.g., bits) of data. A typical flash memory cell comprises a field effect transistor having an electrically isolated charge storage structure such as a floating gate or charge trap that controls electrical conduction in a channel region between source and drain regions of the memory cell. Data values are represented by a charge stored on the charge storage structure, and the resulting change in conductivity observed between the source and drain regions.

When the memory cell is read by placing a specified voltage on the control gate, the electrical impedance between the source and drain of the device will either allow or not allow current to flow, depending on the presence of a charge on the charge storage structure and the effective Vt of the memory cell. The presence or absence of current above a threshold level can be sensed, and used to determine a programmed state of the memory cell, resulting in a particular data value such as a one or zero value being read.

Memory cells can be arranged in a two-dimensional array of rows and columns, where the rows are coupled via an access line, often called a word line, and the columns are coupled via a data line, often called a bit line. The access lines and data lines are used during data read and program operations to select memory cells for reading and programming.

During a programming operation, factors such as leakage can cause erased cells not intended to be programmed to change even though the memory cells are not selected for programming during the programming operation. This is sometimes referred to as a program disturb error.

DETAILED DESCRIPTION

Non-volatile flash memory cells may include a channel region, a control gate and a charge storage structure, such as a floating gate. The control gate is formed of conducting material. The floating gate is not coupled to another conductive element of the memory cell and is instead "floating" in dielectric material. In operation, the floating gate is able to store a charge due to its electrical isolation from other components of the memory cell. Programming or erasing a charge level on the floating gate can be performed via a tunneling process known as Fowler-Nordheim tunneling, in which electrons tunnel through a dielectric separating the floating gate from the channel region. Most flash memory cells are categorized as NOR flash cells or NAND flash cells based on the arrangement of the memory cells or the circuitry used to perform program, read, and erase operations.

Figure 1:
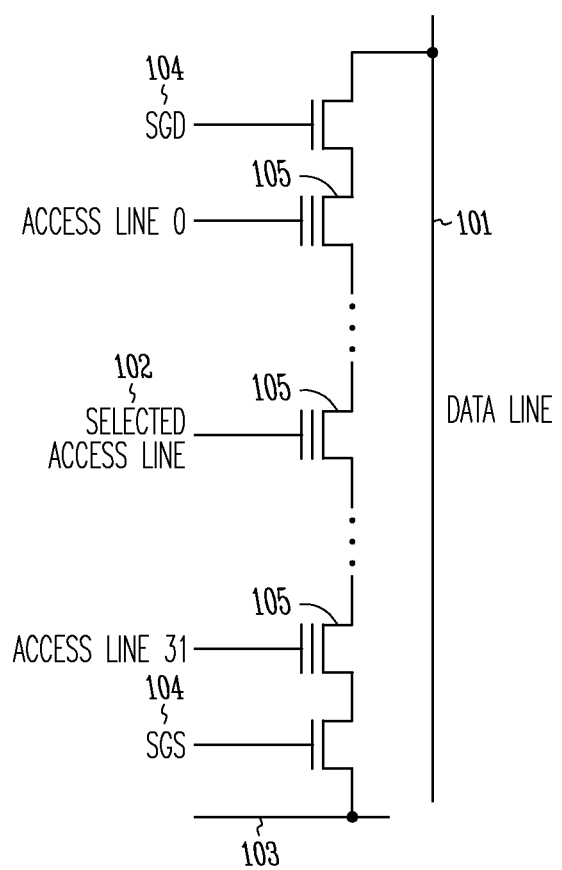
FIG. 1 is a schematic diagram of a string of nonvolatile memory cells in a NAND flash memory configuration, according to various embodiments of the invention.

FIG. 1 shows a portion of a NAND flash memory array that includes a single data line 101, which is coupled to a string of charge storage memory cells 105 coupled in turn to access lines 102, including in this example memory cells 0-31. The string of memory cells 105 are coupled on the other side of the string to source line 103, and can be selectively coupled (e.g., electrically connected) or isolated from the source line 103 and data line 101 by respective select transistors 104.

To perform a program operation for a selected memory cell, the gate of the drain select transistor can be biased to a voltage such that the drain select transistor conducts. The data line 101 can be grounded so that the drain of the selected memory cell is grounded. A bias voltage is applied to the source select transistor so that the transistor is off. The control gate of the memory cell to be programmed is biased to a high (programming) voltage, such as twenty volts, via the access line 102.

Figure 2:
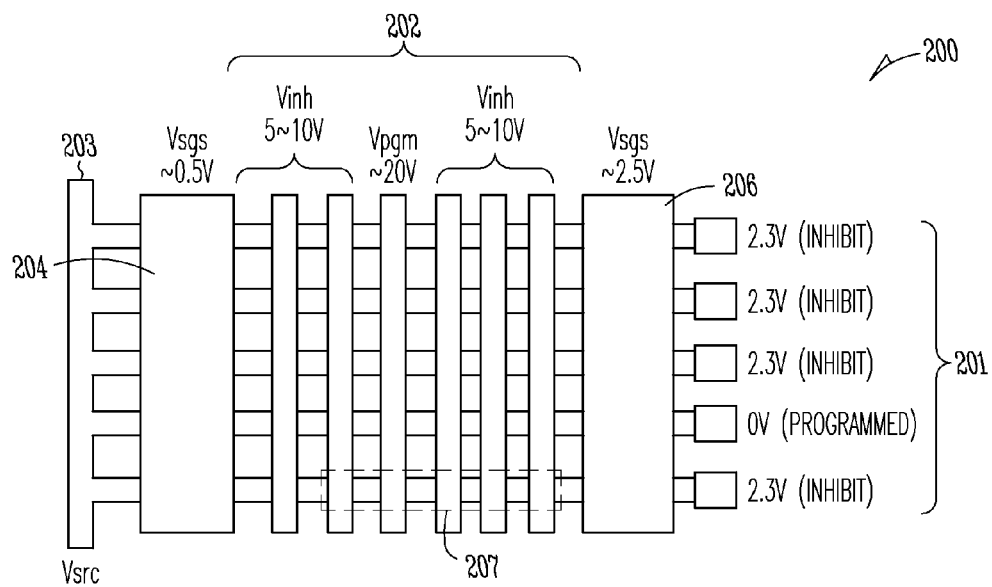
FIG. 2 illustrates a simplified example of an array of memory cells, according to various embodiments of the invention.

FIG. 2 illustrates a simplified example of an array 200 of memory cells. The array 200 includes five data lines 201 and six access lines 202. Memory cells of the array 200 are represented by intersections of the data lines 201 and access lines 202. Thus, the simplified array 200 shows thirty memory cells. Actual memory arrays can include about 64,000 or more memory cells. The array 200 includes five memory cell strings 207 of six memory cells; one memory cell string for each data line. Individual memory cells of the array 200 are coupled to one of the access lines 202.

A memory cell string 207 is coupled to the source line 203 via a select transistor. The source select transistors of the memory cell strings are represented in the Figure by an intersection of the source select gate (SGS) 204 with the channel regions. In the Figure, one SGS 204 is common to all of the five source select transistors. The drain select transistors of the memory cell strings are represented by an intersection of the drain select gate (SGD) with the channel regions. In the Figure, one SGD 206 is common to all of the five source select transistors.

Memory cells in the array 200 can be configured as pages. Typically, a page of memory cells comprises memory cells having their control gates coupled to the same access line. Pages of memory cells can be further configured as even and odd pages, with an even page of memory cells being those memory cells having their control gates coupled to the same access line and being configured to be selectively coupled to one of a first series of (e.g., "even") data lines, and an odd page of memory cells being those memory cells having their control gates coupled to the same access line and being configured to be selectively coupled to one of a second series of (e.g., "odd") data lines that are interleaved with the first series of data lines.

To program a page of memory cells, one access line is used for the page programming and the data lines are biased to select the memory cell(s) of the page to be programmed. A Vsgs bias voltage (e.g., Vsgs~0.5V) is applied to the source select gate 204 to turn the source select transistors off and isolate the source from the memory cells to be programmed. The drain of the selected memory cell is coupled to ground by applying a Vsgd bias voltage (e.g., ~2.5V) to the drain select gate 206 such that the drain select transistors conduct. The data lines of the unselected memory cells of the page are biased to a voltage (e.g., 2.3V) to inhibit programming.

The control gates of the memory cells not being programmed in the selected string(s) are biased via their access lines to a sufficiently high voltage to cause the memory cells to conduct irrespective of their stored charges (e.g., 5-10V). The control gate of the cell(s) to be programmed is biased to a significantly higher voltage (e.g., 20V). The voltage applied to the selected memory cell's control gate forms an inversion region in the channel and tunneling of electrons due to the attraction of electrons to the positively charged control gate coupled to the higher voltage. The grounded drain in combination with the inversion region in the channel material provide a continuous source of electrons for tunneling in the memory cell's inversion region, such that electrons that tunnel onto the charge storage structure can be replaced by electrons from the grounded data line. The memory cell to be programmed in a page is selected (in this embodiment) by a grounded data line. More than one memory cell of the page can be programmed by, for example, grounding multiple data lines of the array 200 of memory cells.

A page of memory cells can be programmed using multiple programming passes. A first programming pass can include applying a programming voltage to an access line of a page of memory cells and then reading the page of memory cells to verify the programming. A second programming pass can be used to program the memory cells of the page that failed verification and the programming is again verified. The process continues until it is verified that at least a threshold number (e.g., all) of the cells of the page to be programmed are indeed correctly programmed. A memory cell may fail verification during a programming pass for various reasons, such as variations in threshold voltages (Vt) of the memory cells for example. The programming voltage is typically increased from the early programming passes to the later programming passes to facilitate programming of failed cells.

Figure 3:
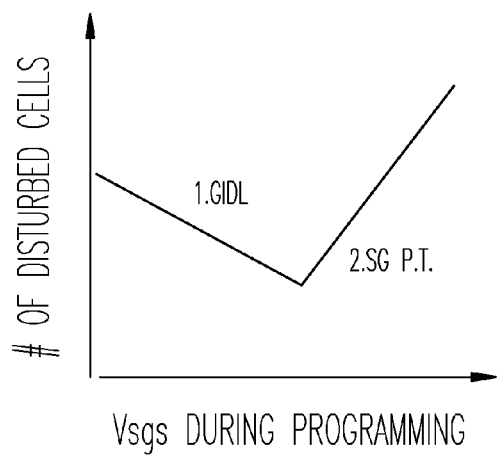
FIG. 3 illustrates a graph of constraints on the Vsgs biasing voltage.

FIG. 3 illustrates a graph of constraints on the Vsgs bias voltage. The graph shows that the Vsgs voltage range window for proper programming is small. If the Vsgs voltage is too low, gate induced drain leakage (GIDL) current at the source junction can cause a program disturb error. Program disturb errors can occur in other cells of the page being programmed or on other pages within the same memory array.

The region where GIDL current is of concern corresponds to region 1 in the graph. The graph shows that as Vsgs is increased from a minimum value, the number of cells incorrectly programmed due to GIDL decreases to a point and then begins to increase. This can occur because once the Vsgs voltage becomes high enough, source punch-through (P.T.) can occur to incorrectly program an inhibited cell. This is shown as region 2 in the graph. Thus, moving from a higher value to a lower value of Vsgs, the occurrence of program disturb due to P.T. decreases. The relatively small window that describes the acceptable Vsgs voltage range results in the memory page being slow to program, leading to the use of more programming passes than might otherwise be applied.

TABLE 1

|  | Early Programming Passes | Later Programming Passes |
|---|---|---|
| Number of Strings Being Programmed | Many | Few |
| Number of Boosted (Inhibited) Strings | Few | Many |
| Boosted Channel Potential | Low | High |
| Risk of GIDL | Low | High |
| Risk of Punch-Through | High | Low |

Table 1 shows how conditions vary during programming of a page of memory cells. The memory cells are in an erased state prior to the programming. In the early programming passes, memory cells from many memory cell strings are being programmed, and the number of strings that are inhibited with a boosted voltage are few. In the later passes, the programming voltage is increased. As the voltage to program the memory cells is increased, the voltage to inhibit programming is also increased. Consequently, during the early programming passes, the boost voltage to inhibit programming is relatively low. The lower boost voltage lowers the risk of program disturb errors due to GIDL current. However, the risk of program disturb errors due to punch-through is higher during early programming passes because there are more strings being programmed.

In the later programming passes, memory cells from relatively fewer memory cell strings are being programmed and many strings are inhibited with a boosted voltage. Because the programming voltage used increases over the programming passes, the boost voltage to inhibit programming during the later programming pulses is relatively high. The higher inhibit voltages raises the risk of program disturb due to GIDL current, while the risk of program disturb from punch-through is low. Because of the increase in programming voltage and inhibit voltage, the bias voltage (Vsgs) applied to the source select transistors can be increased in the later programming passes and the memory cells will program correctly. Increasing Vsgs in the later programming passes also suppresses GIDL current. A lower Vsgs in the early programming passes suppresses punch-through. A lower Vsgs early in the programming passes and an increased Vsgs later in the programming passes widens the window of usable Vsgs voltage and can be used to reduce program disturb errors.

Figure 4:
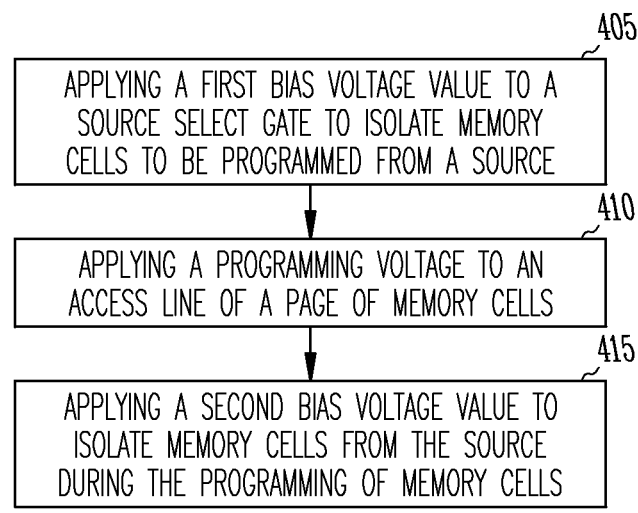
FIG. 4 is a flow diagram of a method of programming at least a portion of an array of memory cells, according to various embodiments of the invention.

FIG. 4 is a flow diagram of a method 400 of programming a page of memory cells. At block 405 during a first pass of programming, a first bias voltage value (Vsgs_early) is applied to a source select gate to isolate memory cells from a source. At block 410, a programming voltage is applied to an access line of a page of the memory cells during the first pass of programming. At block 415, a second bias voltage value (Vsgs_late) is applied to the source select gate to isolate the memory cells from the source during a second pass of programming.

Figure 5:
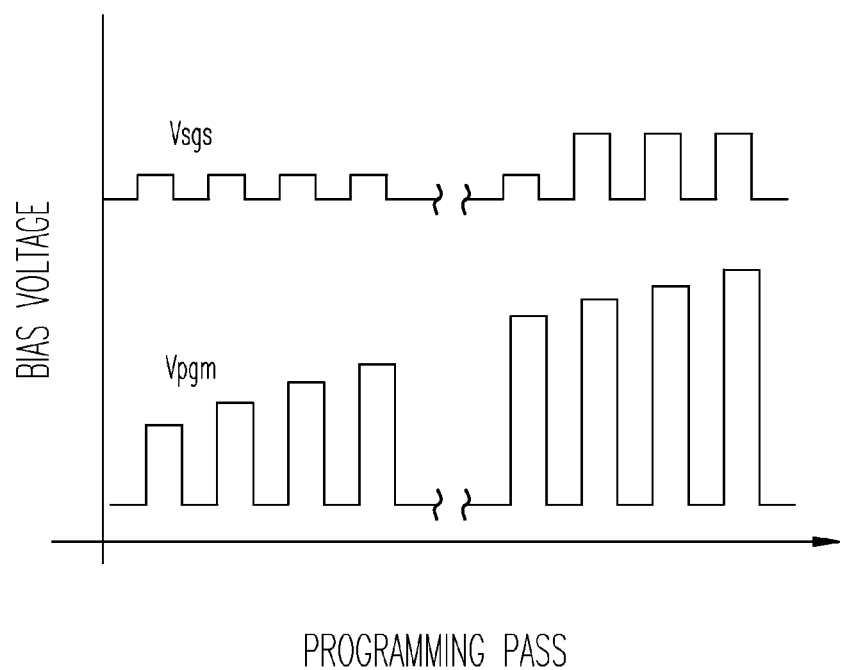
FIG. 5 shows graphs of an example of applying a Vsgs bias voltage a programming voltage Vpgm, according to various embodiments of the invention.

FIG. 5 shows graphs of an example of applying a first bias voltage of Vsgs and a programming voltage Vpgm. The graphs show square wave pulses that represent programming passes. The lower graph shows the programming voltage Vpgm increasing (e.g., monotonically in some embodiments) with each programming pass. In the early programming passes, Vsgs is set to a relatively low voltage (e.g., 0.2V-0.5V). As the programming voltage increases in the later programming passes, Vsgs is set to a higher voltage (e.g., 1.2V-1.5V). Although the graphs show the voltages applied as square waves where the voltage is applied and then removed while increasing monotonically, the voltages may also be applied as step functions where the applied voltage is not removed between programming passes.

Figure 6:
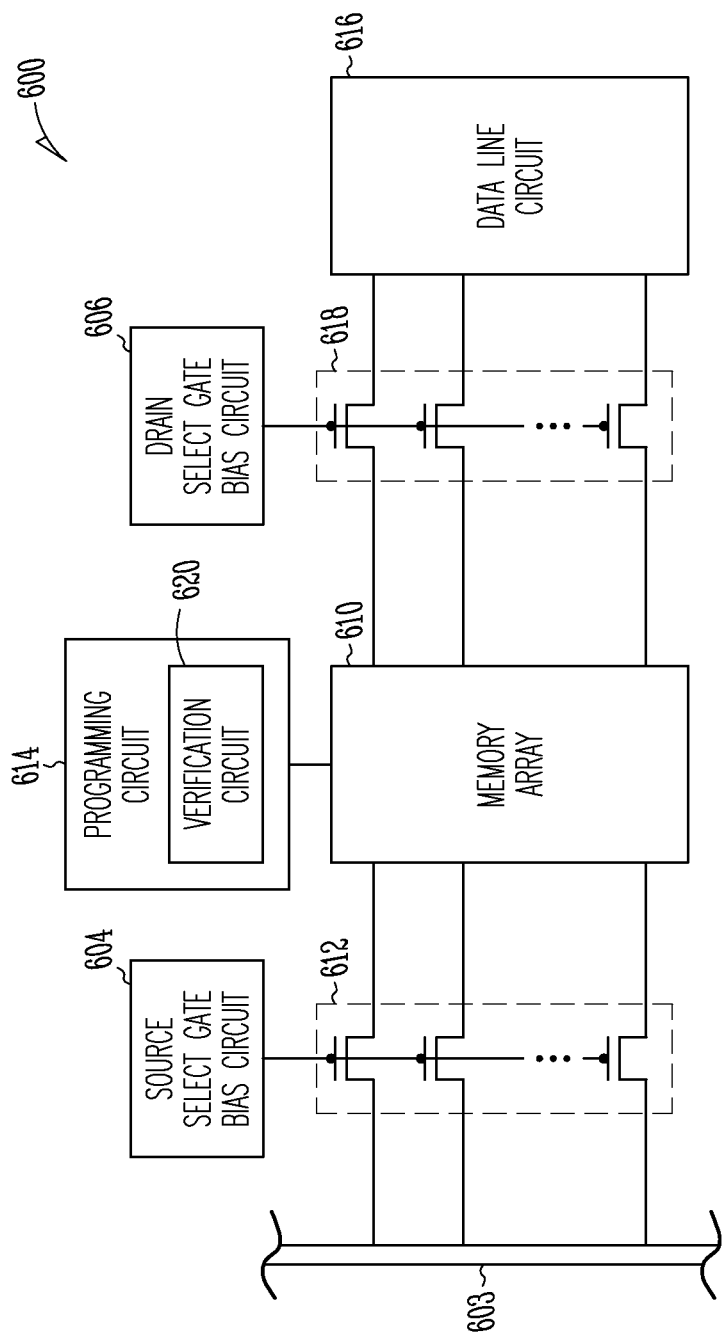
FIG. 6 is a block diagram of portions of an example memory device, according to various embodiments of the invention.

FIG. 6 is a block diagram of portions of an example of a memory device 600. The memory device 600 includes an array 610 of memory cells. In some examples, the array 610 of memory cells is a NAND array of memory cells. In some examples, the array 610 of memory cells is a three dimensional (3D) array of memory cells.

At least a portion of the array 610 of memory cells is configured as a page of memory cells. The array 610 may be similar to or identical to the array 200 of FIG. 2. The memory device 600 includes one or more source select transistors 612, a source select gate bias circuit 604, and a programming circuit 614. The source select transistors 612 are configured to electrically isolate memory cells of the array 610 from a source 603 when the source select transistors 612 are off. The source select gate bias circuit 604 can apply a first bias voltage value (e.g., Vsgs=0.2V) to a source select gate to electrically isolate memory cells of the array 610 from the source 603 during a first pass of programming. The programming circuit 614 can apply a programming voltage to an access line of a page of the memory cells during the first pass of programming. The source select gate bias circuit 604 can apply a second bias voltage value to the source select gate during a second (e.g., later) pass of programming. It should be noted that the terms "first" and "second" are not being used herein in their literal sense. Instead the terms are being used merely to distinguish between two different passes of programming. In some cases, there may be one or more programming passes between what is termed a first programming pass and a second programming pass.

In some embodiments, the memory device 600 includes a data line circuit 616 and a drain select gate bias circuit 606. The data line circuit 616 provides a first data line voltage to enable programming of memory cells during programming and provides a second data line voltage to inhibit programming. The drain select gate bias circuit 606 electrically couples the first data line voltage or the second data line voltage to a memory cell, such as by applying a drain select gate bias voltage (Vsgd) to a drain select gate of transistors 618.

The programming circuit 614 can operate to increase the programming voltage (Vpgm) during the programming passes. The source select gate bias circuit 604 applies a greater bias voltage value (e.g., Vsgs=1.2V) when the higher programming voltage and inhibit voltage is used, such as to reduce program disturb errors.

The programming circuit 614 can provide programming voltages for multiple passes of programming the page of memory cells. In some examples, the programming circuit 614 includes a verification circuit 620 configured to detect memory cells that failed verification during the first programming pass.

The programming circuit 614 can apply a first programming voltage to a selected access line of a page of memory cells during a first programming pass, and select the memory cells of the page that failed verification during the first programming pass, such as by enabling the appropriate data lines during a second programming pass.

The programming circuit 614 can apply a second programming voltage to the selected access line during a second pass of programming of the page of memory cells (e.g., a later pass). The second programming voltage can be greater than the first programming voltage. The source select gate bias circuit 604 applies the first bias voltage to the source select gate during the first programming pass and applies the second bias voltage to the source select gate during the second programming pass. The second bias voltage value can be greater than the first bias voltage value.

According to some examples, the array 610 of memory cells is configured as multiple pages of memory cells. As explained previously herein, one access line may be used when programming a specific page of memory cells.

The programming circuit 614 can apply a first programming voltage to a first access line of a first page of memory cells. The programming circuit 614 can move on to program a different page of memory, such as when it detects that at least a threshold number (e.g., all) of the memory cells of the first page have passed program verification.

A second page of memory cells can be selected for programming by applying a programming voltage to a second access line. In some examples, the source select gate bias circuit 604 applies a different bias voltage value based on the position of the selected access line in the memory device 600.

Figure 7:
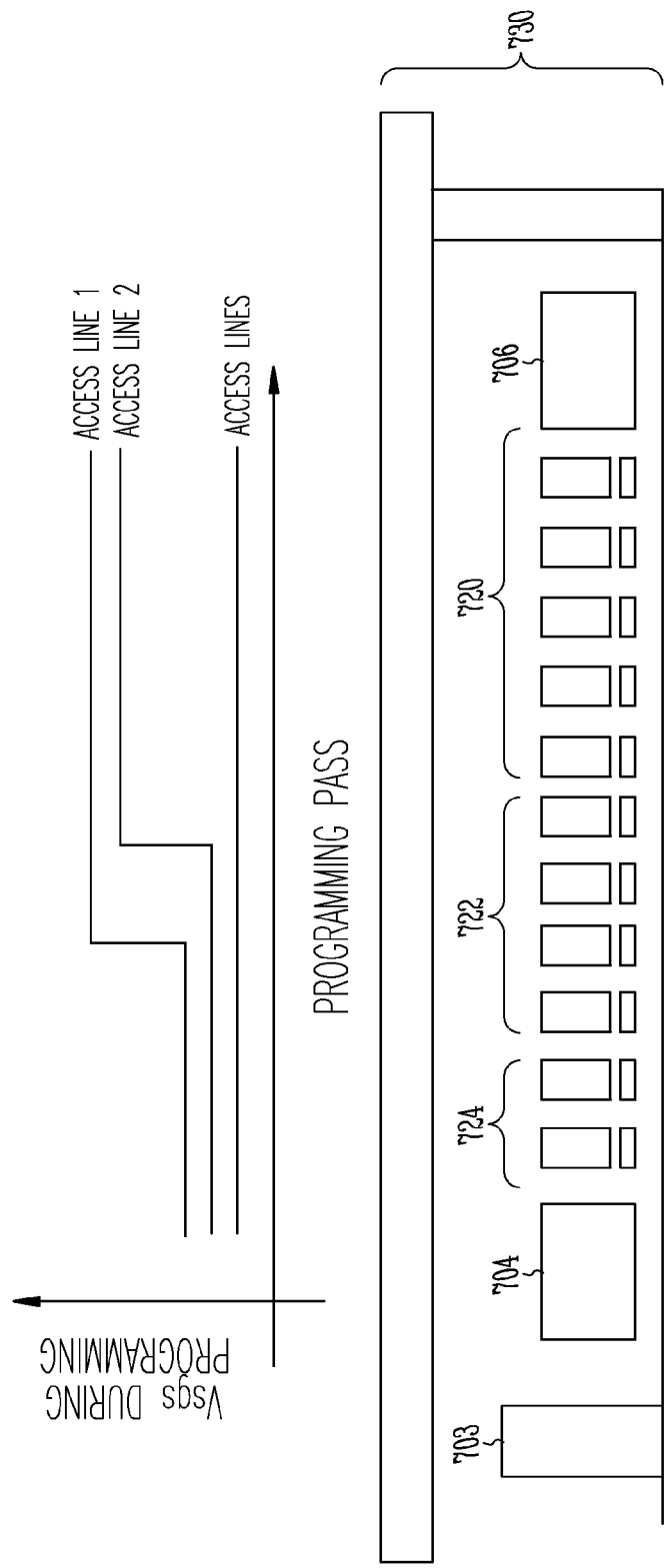
FIG. 7 shows an example of applying different values of Vsgs based on position of an access line, according to various embodiments of the invention.

FIG. 7 shows an example of applying different values of Vsgs based on position of an access line. A portion of a memory device 730 is shown in the lower portion of the Figure. The memory device 730 can be the same or similar to the memory device 600 of FIG. 6. FIG. 7 shows a source 703, a source select gate 704, and a drain select gate 706. Also shown are access lines 720, 722, and 724. Access lines 720 are located closer to the drain select gate 706 and access lines 724 are located closer to the source select gate 704. Access lines 722 can be considered to reside in an intermediate position in relation to the source and drain sides.

Programming memory cells located closer to the source side may be susceptible to a higher risk of program disturb errors from GIDL current. This is because more electron injection to the source occurs when these memory cells are programmed. Using a higher Vsgs bias voltage when programming these pages of memory cells reduces GIDL current and can reduce program disturb errors. It should be noted that the value of the programming voltage does not influence the value of the Vsgs voltage applied. The value of the programming voltage (and consequently the boosted inhibit voltage) used to program a second page of the memory cells can be the same or approximately the same as a value used to program a first page of memory cells or even less than the first value.

In some embodiments, a value of Vsgs is applied by the source select gate bias circuit 604 of FIG. 6 based on a combination of a boosted inhibit voltage and access line position. As programming passes are executed, the source select gate bias circuit 604 can increase Vsgs as the programming voltage and the inhibiting voltage are increased.

Returning to FIG. 7, different Vsgs bias voltages can be used based on whether the access line is a source side access line 724, a drain side access line 720, or an intermediate access line 722. The source side access line is included in a first set of access lines located within a specified number of access lines from the one or more source select transistors. The drain side access line is included in a second set of access lines located a specified number of access lines away from the source select transistors or within a specified number of the drain select transistors. The third access line is an intermediate access line that is not a member of the first and second set of access lines. If the source select gate bias circuit 604 applies a first bias voltage value to the select transistors when a page of memory is programmed using a source side access line 724, and applies a second bias voltage value to the select transistors when a page of memory is programmed using a drain side access line 720, the source select gate bias circuit 604 can apply a third bias voltage value to the select transistors when a page of memory is programmed using an intermediate access line.

As shown in the top portion of FIG. 7, different values of Vsgs can be applied to the source select transistors during different programming passes based on the position of the access line of the page of memory cells being programmed. The source select gate bias circuit 604 of FIG. 6 applies a first bias voltage value to one or more source select transistors during the programming of the first page of memory cells and applies a second bias voltage to the source select transistors during programming of the second page of memory cells. The value of the Vsgs can be based on the position of the access line. As shown in FIG. 7, Vsgs is increased when programming a source side access line, while Vsgs is not changed when programming a drain side access line. The source select gate bias circuit 604 may change Vsgs differently based on the position of the access line of the page being programmed. For example, the voltages used for Vsgs may be different based on the access line position, or Vsgs may be increased using different voltage steps depending on the access line position.

Considering FIGS. 6 and 7, and assuming that the programming is executed starting with pages having source side access lines 724, the programming circuit 614 of FIG. 6 may apply a greater Vsgs bias voltage value to a source select transistor 612 when the access line is located closer to the source select transistor and apply a lesser Vsgs bias voltage value to the source select transistor when the access line is located farther away from the source select transistor (e.g., a drain side access line). As shown in FIG. 7, different Vsgs bias voltages can be applied with respect to different source side access lines 724. Thus, every source side access line 724 does not have to be biased in the same way. Of course, starting programming from the source side is merely an example of one embodiment, and programming may begin on the drain side in other embodiments. For instance, a higher Vsgs voltage can be used in the later programming passes if the access line in those passes is a source side access line 724.

The methods, devices, and systems described herein can operate to increase the window of useful voltage values for Vsgs, permitting flash memory to be successfully programmed in fewer programming passes. It should be noted that the examples described herein use simple memory arrays to explain the inventive concepts with the least possible detail. Decreasing the number of passes required to program actual memory arrays that contain thousands of cells arranged in two or three dimensions can significantly speed up the programming process.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract of the Disclosure is submitted with the understanding that it will not be used to interpret or limit the scope or meaning of the claims.

What is claimed is:

1. A method comprising:
applying, during a first pass of programming, a first bias voltage value to a source select gate to isolate memory cells from a source;
applying a programming voltage to an access line of a page of the memory cells during the first pass of programming; and
applying a second bias voltage value to the source select gate to isolate the memory cells from the source during a second pass of programming.

2. The method of claim 1, wherein the first and second passes of programming are among multiple programming passes for the page, and wherein applying a second bias voltage value to the source select gate to isolate the memory cells from the source during a second pass of programming comprises applying the second bias voltage value to the source select gate to isolate the memory cells from the source during a second pass of programming the page.

3. The method of claim 2, wherein the programming voltage comprises a first programming voltage, and the method further comprises applying a second programming voltage to the access line of the page, wherein the second programming voltage is greater than the first programming voltage and the second bias voltage value is greater than the first bias voltage value.

4. The method of claim 3, wherein the programming voltage is stepped from the first programming voltage to the second programming voltage and the bias voltage is stepped from the first bias voltage value to the second bias voltage value.

5. The method of claim 2, wherein the bias voltage value applied to the source select gate during the multiple programming passes is increased monotonically.

6. The method of claim 3, wherein applying a second programming voltage to the access line of the page comprises applying the second programming voltage responsive to detecting that more than a threshold number of the memory cells of the page failed program verification.

7. The method of claim 1, wherein applying a programming voltage to an access line of a page of the memory cells during the first pass of programming comprises applying the programming voltage to a first access line of a first page of the memory cells during the first pass of programming, wherein the method further comprises applying the programming voltage to a second access line of a second page of the memory cells during the second pass of programming.

8. The method of claim 7, wherein applying the programming voltage to a second access line of a second page of the memory cells during the second pass of programming comprises applying the programming voltage to the second access line responsive to detecting that at least a threshold number of the memory cells of the first page passed program verification.

9. The method of claim 7, wherein the first access line is located closer to the source select gate than the second access line, and the second bias voltage value is less than the first bias voltage value.

10. The method of claim 9, including:
responsive to detecting that at least a threshold number of the memory cells of the second page of memory cells passed program verification, applying the programming voltage to a third access line of a third page of memory cells; and
applying a third bias voltage value to the source select gate to isolate the memory cells from the source during a third pass of programming, wherein the second access line is located closer to the source select gate than the third access line.

11. The method of claim 10, wherein the third bias voltage is different from both the first bias voltage and the second bias voltage.

12. The method of claim 9, wherein the programming voltage is the same during the first pass of programming and the second pass of programming.

13. The method of claim 7, wherein the second access line is located closer to the source select gate than the first access line, wherein an inhibit voltage applied to a memory cell to inhibit programming is greater during the second programming pass than the first programming pass, and the first bias voltage value is less than the second bias voltage value.

14. The method of claim 7, wherein the first access line is located in a different position with respect to the source select gate than the second access line, and the second bias voltage value is different from the first bias voltage value.

15. The method of claim 1, wherein an intervening programming pass occurs between the first programming pass and the second programming pass.

16. A memory device comprising:
a source;
a string of memory cells;
a source select transistor coupled between the string of memory cells and the source;
a source select gate bias circuit configured to apply a first bias voltage value to the source select transistor to electrically isolate the string of memory cells from the source during a first pass of programming and to apply a second bias voltage value to the source select transistor during a second pass of programming; and
a programming circuit configured to:
apply a first programming voltage value to a control gate of the selected memory cell of the string of memory cells during the first pass of programming; and
apply a second programming voltage value to the control gate of the selected memory cell of the string of memory cells during the second pass of programming, wherein the second programming voltage is greater than the first programming voltage.

17. The memory device of claim 16, wherein the second bias voltage value is greater than the first bias voltage value.

18. The memory device of claim 16, wherein a programming circuit configured to apply a programming voltage to a control gate of a selected memory cell of the string of memory cells comprises a programming circuit configured to:
apply the programming voltage to a control gate of a first selected memory cell of the string of memory cells during the first pass of programming; and
apply the programming voltage to a control gate of a second selected memory cell of the string of memory cells during the second pass of programming,
wherein the first selected memory cell of the string is closer to the source than the second selected memory cell, and
wherein the first bias voltage value is greater than the second bias voltage value.

19. The memory device of claim 16, wherein the first selected memory cell of the string is closer to the source than the second selected memory cell, wherein the programming circuit applies a same programming voltage value during the first pass of programming and the second pass of programming, and wherein first bias voltage value is greater than the second bias voltage value.

20. The memory device of claim 16, wherein the second selected memory cell of the string is closer to the source select gate than the first selected memory cell of the string, wherein the programming circuit is configured to apply an inhibit voltage to a third memory cell of the string to inhibit programming of the third memory cell, wherein the applied inhibit voltage is greater during the second programming pass than the first programming pass, and wherein the first bias voltage value is less than the second bias voltage value.

21. The memory device of claim 16, wherein the first selected memory cell is located in a different position with respect to the source select gate than the second selected memory cell, and wherein the second bias voltage value is different from the first bias voltage value.

22. The memory device of claim 16, wherein the string of memory cells is a vertical NAND string in a three-dimensional array of memory cells.

23. The memory device of claim 16, further comprising:
a data line;
a data line circuit configured to apply a first data line voltage to the data line to enable programming of the string and to apply a second data line voltage to the data line to inhibit programming of the string; and
a drain select transistor coupled between the data line and the string of memory cells.

* * * * *